United States Patent
Verove

(10) Patent No.: US 6,410,425 B1
(45) Date of Patent: Jun. 25, 2002

(54) INTEGRATED CIRCUIT WITH STOP LAYER AND METHOD OF MANUFACTURING THE SAME

(75) Inventor: Christophe Verove, Saint Martin d'Hères (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/292,464

(22) Filed: Apr. 15, 1999

(30) Foreign Application Priority Data

Apr. 16, 1998 (FR) ............................. 98-04754

(51) Int. Cl.⁷ ...................... H01L 21/4763; H01L 21/44
(52) U.S. Cl. ...................... 438/638; 438/622; 438/624; 438/637; 438/675; 438/672
(58) Field of Search ................. 438/638, 634, 438/637, 622, 624, 623, 636, 675, 672, 687, 688

(56) References Cited

U.S. PATENT DOCUMENTS

| | | | |
|---|---|---|---|
| 5,736,457 A | 4/1998 | Zhao | 438/624 |
| 5,880,018 A * | 3/1999 | Boeck et al. | 438/619 |
| 5,959,361 A * | 9/1999 | Huang et al. | 257/774 |

FOREIGN PATENT DOCUMENTS

| | | |
|---|---|---|
| DE | 196 10 272 A1 | 2/1997 |
| EP | 0 463 956 A1 | 1/1992 |
| EP | 0 680 085 A1 | 11/1995 |
| WO | WO 96/12297 | 4/1996 |

OTHER PUBLICATIONS

French Search Report dated Dec. 14, 1998 with annex on French Application No. 9804754.

"Fine–Line Patterning of Parylene–n by Reactive Ion Etching for Application as an Interlayer Dielectric", Journal of the Electrochemical Society, vol. 143, No. 6, Jun. 1996, pp. 1974–1977, Manchester, New Hampshire, US.

"Damascene Copper Interconnects With Polymer ILDs", Thin Solid Films, vol. 308–309, No. 1–4, Oct. 31, 1997, pp. 523–528, Troy, New York, US.

\* cited by examiner

Primary Examiner—Charles Bowers
Assistant Examiner—Thanhha Pham
(74) Attorney, Agent, or Firm—Lisa K. Jorgenson; Stephen Bongini; Fleit, Kain, Gibbons, Gutman & Bongini P.L.

(57) ABSTRACT

A method of manufacturing an integrated circuit is provided. According to the method, first and second stop layers are deposited on a first dielectric layer that covers a first metallization level. The second stop layer is selectively etched with respect to the first stop layer, and the first stop layer is selectively etched with respect to the first dielectric layer. A second dielectric layer and a third stop layer are deposited. The third stop layer is selectively etched with respect to the second dielectric layer, and the first and second dielectric layers are selectively etched with respect to the stop layers so as to form trenches in the second dielectric layer and holes in the first dielectric layer. Additionally, an integrated circuit is provided that includes first and second metallization levels. A dielectric layer is located between the metallization levels, and a first stop layer is located between the dielectric layer and the second metallization level. A second stop layer is located above the first stop layer, and a third stop layer is located above the dielectric material of the second metallization level. In one preferred embodiment, lines of at least one metallization levels are made of copper, and the dielectric layer is made of an organic polymer having an electrical permittivity coefficient of less than 3.

6 Claims, 3 Drawing Sheets

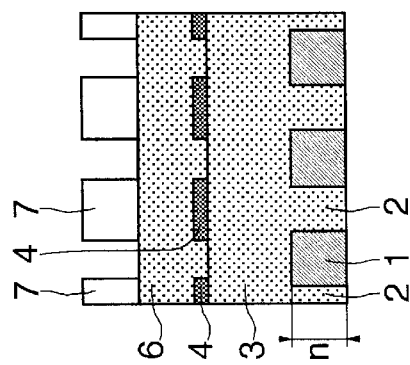
FIG.1a
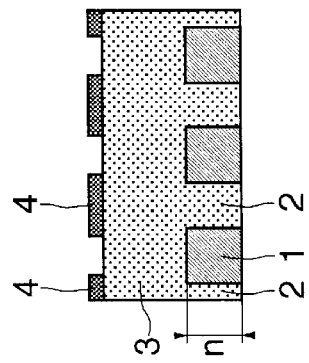
FIG.1b
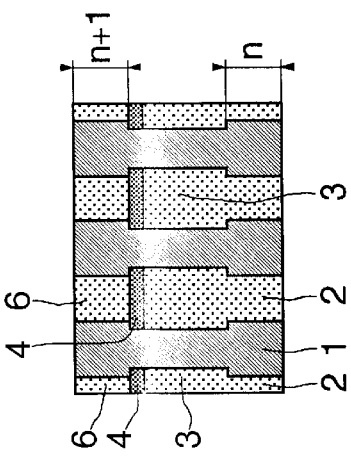
FIG.1c
FIG.1d
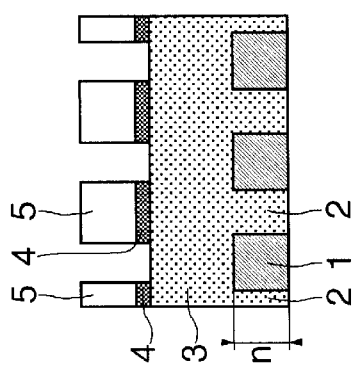
FIG.1e
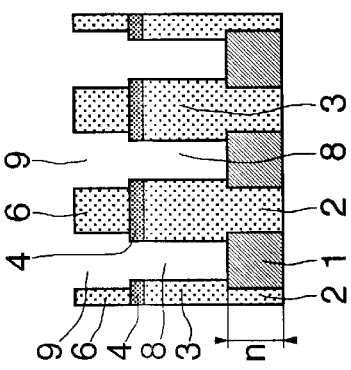
FIG.1f
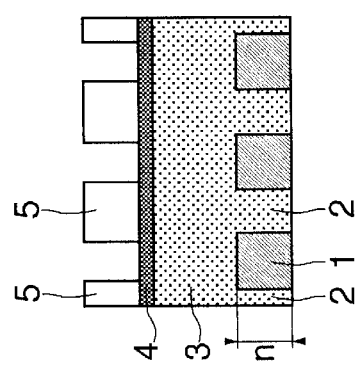
FIG.1g

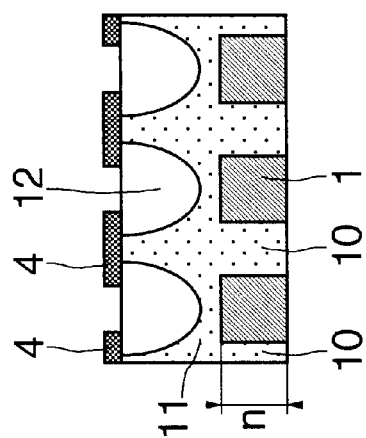
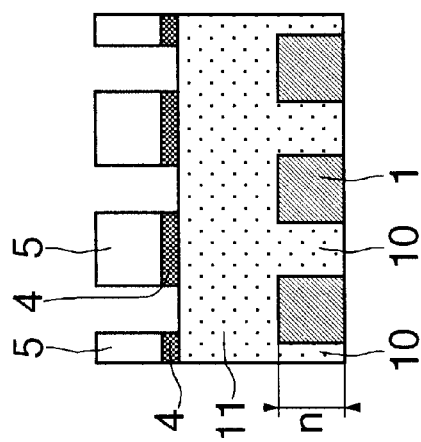
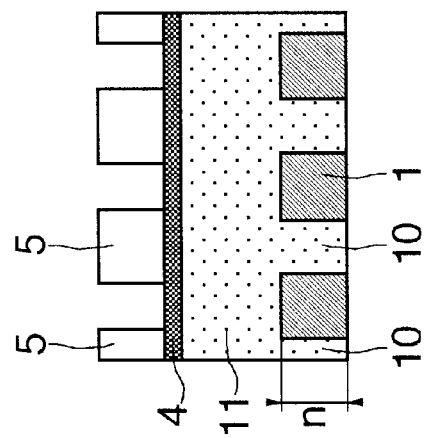

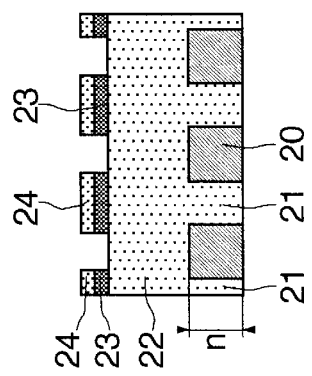
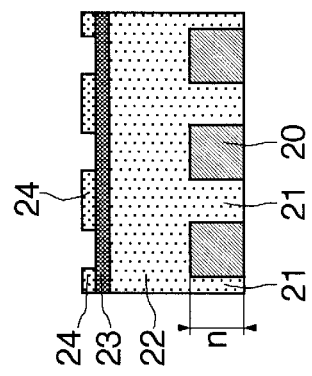
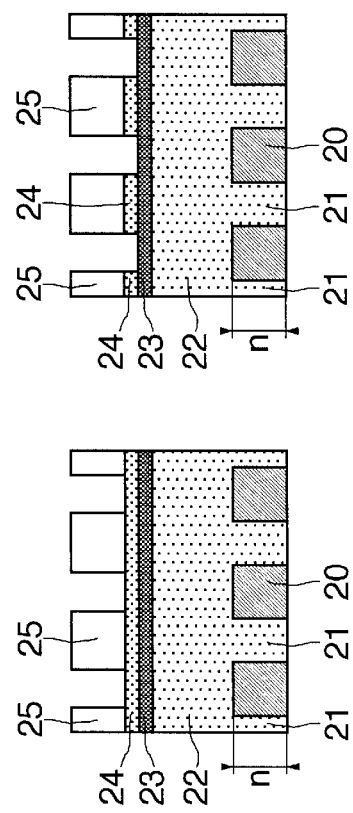
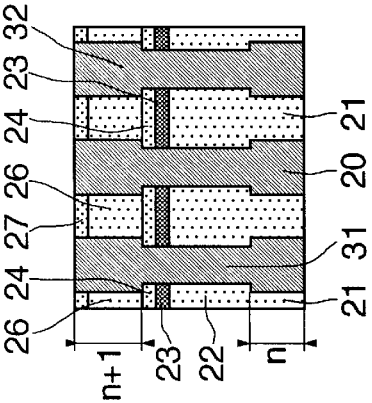
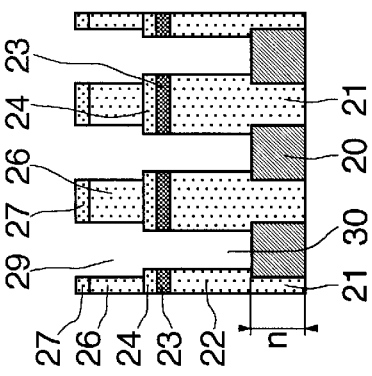
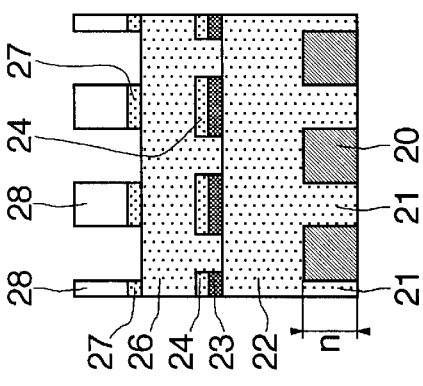
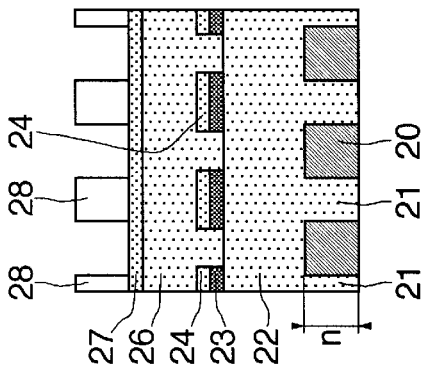

INTEGRATED CIRCUIT WITH STOP LAYER AND METHOD OF MANUFACTURING THE SAME

CROSS-REFERENCE TO RELATED APPLICATIONS

This application is based upon and claims priority from prior French Patent Application No. 98-04754, filed Apr. 16, 1998, the entire disclosure of which is herein incorporated by reference.

BACKGROUND OF THE INVENTION

1. Field of the Invention

The present invention relates to integrated circuits, and more specifically to a semiconductor integrated circuit having a stack of conducting layers separated by insulating layers.

2. Description of Related Art

In conventional integrated circuits, it is necessary to establish electrical connections between conducting metallized layers that are on different levels and separated by one or more insulating layers. Two conducting layers are conventionally electrically connected using holes that are provided in the insulating layer and filled with metal, such a connection being known as a "via". One way of producing such integrated circuits is through a process known as the "Damascene" process. A first insulating layer is deposited on a metallization layer of level n. The holes are etched through the insulating layer, and the metal for the via is deposited and polished until it is level with the upper surface of the insulating layer.

Then, a new insulating layer is deposited on the formed via of level n and the trenches for the lines are etched. The metal for the lines of the metallization layer of level n+1 is deposited, and then polished until level with the upper surface of the insulating layer. The Damascene process is well suited for producing copper lines and vias because, although copper has advantageous electrical properties for narrow lines, it cannot be etched at ambient temperature. Additionally, the Damascene process can be used with the metals more commonly used to form lines and vias.

In a "double Damascene" process, the metal is deposited in both the vias and the lines and then polished. A stop layer, usually made of nitride, is provided between an insulating layer of level n and the metallization level n+1. In order to obtain the final structure, there must be excellent etching selectivity for the oxide of the insulating layer with respect to the nitride.

In order to increase the density of integrated circuits, attempts have been made to reduce the width of the metal lines and of the dielectric material separating metal lines. However, the electrical capacitance between two adjacent metal lines is inversely proportional to the distance separating them. Thus, by reducing this distance to increase the density of the circuit, the interline capacitance is increased. This is a problem because it causes an increase in the propagation constant of the electrical signal in the lines, $\tau = RC$ (R being the resistance of the metal line and C being the interline capacitance), as well as in an increase in the parasitic coupling between two electrical signals propagating in two adjacent lines (i.e., the crosstalk effect).

The interline capacitance is proportional to the permittivity coefficient "k" of the dielectric material that is used, so there is a tendency to use dielectric materials having a low permittivity coefficient "k". For example, dielectric organic polymers having permittivity coefficients more than 30% lower than the typical silicon oxide $SiO_2$ can be used. However, these organic polymers create etching problems because their chemical composition is close to that of the resin mask that is used to photo-etch the trenches. More specifically, the resin mask is removed by an isotropic etching in which the etching ions move in all directions. This can cause the organic polymer that serves as the dielectric to be impaired, or even etched. A similar problem results from the use of a dielectric made from an inorganic polymer whose surface becomes impaired so as to locally degrade the permittivity coefficient.

SUMMARY OF THE INVENTION

In view of these drawbacks, it is an object of the present invention to remove the above-mentioned drawbacks and to provide a Damascene-type process for manufacturing an integrated circuit using a dielectric having a low permittivity coefficient. According to the process, first and second stop layers are deposited on a first dielectric layer that covers a first metallization level, and the second stop layer is selectively etched with respect to the first stop layer. The first stop layer is selectively etched with respect to the first dielectric layer, a second dielectric layer is deposited on the circuit. The first and second dielectric layers are selectively etched with respect to the stop layers. In this manner, trenches are formed in the second dielectric layer and holes are formed in the first dielectric layer. Thus, a dielectric made of an organic or inorganic polymer having a low permittivity coefficient can be used without causing degradation, and low interline capacitances can be obtained.

In one preferred method, a third stop layer is deposited on the second dielectric layer. The third stop layer is selectively etched with respect to the second dielectric layer.

In one preferred method, after the trenches and holes are formed, metal is deposited in the holes and trenches to form the lines of a second metallization level and vias connecting the lines of first and second metallization levels. Then, the metal of the lines of the second metallization level is polished. In another preferred method, an encapsulation layer (e.g., of silicon nitride) is placed around the metal lines. The encapsulation layer is useful when the metal used for the lines is of a type that could diffuse into the dielectric. Such diffusion of metal (especially of copper or gold) into the dielectric would result in a decrease in the interline electrical isolation. The major risk is that the metallic contamination could reach the silicon substrate to create deep energy levels in the band gap of the semiconductor and increase the resistivity of the substrate.

Another object of the present invention is to provide an integrated circuit in which the dielectric layer is of a type that would conventionally be impaired by the etching process for removing the resin mask that is used to photo-etch the positions of the metallization lines. The integrated circuit includes at least first and second metallization levels that each include metallization lines separated by dielectric material. A dielectric layer is located between the two metallization levels and penetrated by vias that provide electrical connection between the metallization lines of the two metallization levels. A first stop layer, which is capable of being selectively etched with respect to the dielectric layer, is located between the dielectric layer and the second metallization level. Additionally, a second stop layer, which is capable of being selectively etched with respect to the first stop layer, is located above the first stop layer. The stop layers are provided because the mask used for photo-etching is of a similar nature to the polymers having a low permittivity coefficient, which are desirable (especially organic polymers) but would conventionally be impaired during removal of the mask.

Preferably, a third stop layer, which is capable of being selectively etched with respect to the dielectric material of the second metallization level, is located above the dielectric material of the second metallization level.

Accordingly, preferred embodiments of the present invention provide an integrated circuit that can have very small line widths and very small interline widths of dielectric material because the dielectric used has a low permittivity coefficient but is not degraded during the Damascene-type process for forming the circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 1a through 1g show steps of a conventional double Damascene process;

FIGS. 2a through 2c show steps of a conventional double Damascene process using a dielectric made of an organic polymer; and FIGS. 3a through 3h show steps of an integrated circuit manufacturing process according to a preferred embodiment of the present invention.

DETAILED DESCRIPTION OF PREFERRED EMBODIMENTS

Preferred embodiments of the present invention will be described in detail hereinbelow with reference to the attached drawings.

As shown in the cross-sectional drawing of FIG. 1a, an integrated circuit includes metal lines 1 of a metallization level n that are separated by a dielectric material 2. The metallization level n is covered with a dielectric layer 3 (e.g., a silicon oxide having a permittivity coefficient on the order of 4) of the same nature as the dielectric material 2. The dielectric layer 3 is covered with a stop layer 4 having a chemical composition that is slightly different so as to allow it to be selectively etched with respect to the dielectric layer 3. The stop layer 4 is partially covered by a mask 5 for photo-etching.

The stop layer 4 is selectively etched with respect to the dielectric layer 3 and with respect to the mask 5 as shown in FIG. 1b, and then the mask 5 is removed as shown in FIG. 1c. The removal of the mask has no effect on the dielectric layer 3 because the composition of the mask 5 differs from that of the dielectric layer 3. Next, as shown in FIG. 1d, the circuit is covered with dielectric material 6 and another mask 7. The dielectric material 6 and the dielectric layer 3 are selectively etched with respect to the mask 7 and the stop layer 4 so as to define holes 8 that penetrate the dielectric layer 3 and trenches 9 that penetrate the dielectric material 6, as shown in FIG. 1e.

Then, as shown in FIG. 1f, the mask 7 is selectively removed with respect to the dielectric material 6 and the dielectric layer 3 in the same manner as the mask 5. As shown in FIG. 1g, the holes 8 and trenches 9 are filled with metal so that the holes 8 filled with metal form vias between metallization levels n and n+1 and the trenches 9 filled with metal form the lines of metallization level n+1. While the process of FIGS. 1a through 1g can be used to form an integrated circuit, such a process is not suitable for manufacturing circuits using dielectric materials having a low permittivity coefficient, as will now be explained with reference to FIG. 2.

FIGS. 2a through 2c show the same processing steps as shown in FIGS. 1a through 1c, but different dielectric materials are used. In FIGS. 2a through 2c, the dielectric material 10 separating the metallization lines 1 and the dielectric layer 11 are both made from a dielectric having a low permittivity coefficient of the organic polymer type, and the stop layer 4 is provided to allow selective etching with respect to the dielectric layer 11. As shown in FIG. 2c, the process for removing the mask 5 is not selective with respect to the dielectric layer 11. Thus, holes 12 are formed of a shape that is absolutely uncontrollable because the etching process used to remove the mask 5 is of the isotropic type (i.e., it etches the material in all directions). If metal were to be deposited in the holes 12, unsatisfactory electrical isolation and a high capacitance between the vias would result. Thus, an integrated circuit having unacceptable characteristics would be produced.

FIGS. 3a through 3h show a process according to a preferred embodiment of the present invention that allows a dielectric having a low permittivity coefficient (of the inorganic or organic type) to be used in a Damascene-type process. As shown in FIG. 3a, the integrated circuit includes a metallization level n having metallized lines 20 (e.g., made of copper) that are separated by a dielectric 21. The metallization level n is covered with a dielectric layer 22 that is made with the same low permittivity coefficient material as the dielectric 21, such as one of the inorganic type known as "Fox" having a permittivity coefficient of 3 or one of the organic type known as "Silk" having a permittivity coefficient of 2.6. (The latter being preferable because it can be used in thick layers of for example 2 μm, unlike the inorganic dielectric which is limited to 0.7 μm. This drawback is added to that of having a slightly higher permittivity coefficient.)

The dielectric layer 22 is covered with a first stop layer 23 and a second stop layer 24. The first stop layer 23 is of a composition that can be selectively etched with respect to the dielectric layer 22, and the second stop layer 24 is of a composition that can be selectively etched with respect to the dielectric layer 22 and the first stop layer 23. The second stop layer 24 is covered with a mask 25 for photo-etching. Next, as shown in FIG. 3b, the second stop layer 24 is selectively etched with respect to the mask 25 and the first stop layer 23 so that those portions of the second stop layer 24 that are not covered by the mask 25 are removed (because of their exposure to the etching process).

As shown in FIG. 3c, the mask 25 is then removed selectively with respect to the second stop layer 24 and the first stop layer 23 using an oxygen-rich plasma. At this stage, the dielectric layer 22 is completely protected by the first stop layer 23. Next, as shown in FIG. 3d, the first stop layer 23 is selectively etched with respect to the second stop layer 24 and the dielectric layer 22. As shown in FIG. 3e, an additional dielectric layer 26 is then deposited on the integrated circuit. The additional dielectric layer 26 can be made of the same material as the dielectric layer 22. The additional dielectric layer 26 is then covered with a third stop layer 27 that can be selectively etched with respect to the additional dielectric layer 26, and with a mask 28 for photo-etching.

The third stop layer 27 is selectively etched with respect to the mask 28 and the additional dielectric layer 26, as shown in FIG. 3f, with those portions of the third stop layer 27 that are protected by the mask 28 remaining in place while the other portions are removed by the etching. As shown in FIG. 3g, the additional dielectric layer 26 and the dielectric layer 22 are etched in a selective way with respect to the third stop layer 27 and the second stop layer 24 to form trenches 29 in the additional dielectric layer 26 and holes 30 in the dielectric layer 22 and the first and second stop layers 23 and 24. Because this etching operation must be selective with respect to the second and third stop layers 24 and 27, they can be made of the same material (e.g., silicon oxide $SiO_2$ or silicon oxynitride SiON).

Further, in one embodiment, a first stop layer made of silicon oxynitride SiON or silicon nitride SiN is provided. In another embodiment, a first stop layer made of silicon nitride is provided. It is also possible to use first and second stop layers whose composition is the reverse of that explained above, or a third stop layer of a composition different from that of the second. It is preferable to use a thin (e.g., 200 to 300 Å) silicon nitride layer because of its high permittivity coefficient. A silicon oxide layer may be thicker (e.g., 1000 Å) because of a more satisfactory permittivity. A layer of oxynitride SiON may be advantageously employed because of its anti-reflective characteristics that prevent a change in hole size during photo-etching. The thickness of this layer with respect to the wavelength of the light that is used can be optimized to prevent the mask from being etched at the edges of the holes.

After the trenches 29 and holes 30 have been etched, they are filled with metal to form vias 31 in the holes 30 and lines 32 in the trenches 29, and thus the metallization level n+1. The process can then be repeated to form an integrated circuit having more than two metallization levels. During removal of the mask 25, the dielectric layer 22 is protected by the presence of two stop layers, the second of which was subjected to an etching operation that marks the future positions of the vias. When etching the trenches 29 and holes 30, the integrated circuit is electrically biased so that the trajectory of the ions that perform the etching is vertical, in order to etch the material in only the vertical direction (e.g., to effect anisotropic etching).

During this etching, the mask 28 placed on the third stop layer 27 is rapidly consumed by the plasma ions that strike the surface of the integrated circuit at the points where the mask 28 is located. The removal of the mask 28 and the etching of the trenches 29 and holes 30 are therefore carried out simultaneously. Importantly, this anisotropic etching does not affect those portions of the dielectric layer 22 and the additional dielectric layer 26 that are protected by the various stop layers. Thus, it is possible to obtain suitably shaped trenches 29 and holes 30 while maintaining an approximately constant thickness of dielectric material between them.

In a preferred embodiment, the metallization lines are made of copper or gold, and the dielectric layer is made of an organic polymer having an electrical permittivity coefficient of less than 3 (e.g., a "Silk" polymer having a coefficient k of 2.6). Further, in preferred embodiments, the dielectric material of the metallization levels is identical to that of the dielectric layer. In one preferred embodiment, the first stop layer is made of silicon nitride or silicon oxynitride, and the second stop layer is made of silicon oxide. In preferred embodiments, there is either: a first stop layer made of silicon nitride and a second stop layer made of silicon oxide, or a first stop layer made of silicon nitride and a second stop layer made of silicon oxynitride, or a first stop layer made of silicon oxynitride and a second stop layer made of silicon oxide. The third stop layer is made of one of these three materials.

Accordingly, the present invention provides a Damascene-type process for manufacturing an integrated circuit with dielectric layers having a low permittivity coefficient. Thus, copper lines and vias can be produced with small etching widths and the integration density of the integrated circuit can be increased.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method of manufacturing an integrated circuit, said method comprising the steps of:

depositing first and second stop layers on a first dielectric layer that covers metallization lines of a first metallization level;

selectively etching the second stop layer with respect to the first stop layer;

selectively etching the first stop layer with respect to the first dielectric layer;

depositing a second dielectric layer so as to cover the first and second stop layers and the first dielectric layer;

selectively etching the first and second dielectric layers with respect to the first and second stop layers so as to form trenches in the second dielectric layer and holes in the first dielectric layer; and depositing metal in the holes and trenches so as to form vias in the holes and metallization lines of a second metallization level in the trenches, each of the vias connecting at least one of the metallization lines of the first metallization level and at least one of the metallization lines of the second metallization level.

2. The method as defined in claim 1, wherein the second metallization level includes metallization lines separated by the second dielectric layer and the first metallization level includes metallization lines separated by a third dielectric layer.

3. The method as defined in claim 1, further comprising the steps of: depositing a third stop layer on the second dielectric layer; and selectively etching the third stop layer with respect to the second dielectric layer.

4. The method as defined in claim 3, further comprising the steps of: after depositing the first and second stop layers, depositing a first mask on the second stop layer; and after depositing the third stop layer, depositing a second mask on the third stop layer.

5. The method as defined in claim 2, wherein in the step of selectively etching the first and second dielectric layers, the second mask is removed simultaneously with the forming of the trenches and holes.

6. The method as defined in claim 4, wherein the first and second masks are resin masks.

* * * * *